United States Patent [19]
Nakanishi et al.

[11] Patent Number: 5,138,274
[45] Date of Patent: Aug. 11, 1992

[54] LINEAR AMPLIFIER CIRCUIT

[75] Inventors: Eiichi Nakanishi; Tetsuo Onodera, both of Tokyo, Japan

[73] Assignee: Oki Electric Industry Co., Ltd., Tokyo, Japan

[21] Appl. No.: 707,455

[22] Filed: May 30, 1991

[30] Foreign Application Priority Data

Jun. 6, 1990 [JP] Japan .................. 2-146199

[51] Int. Cl.⁵ .............................................. H03G 3/30
[52] U.S. Cl. ..................................... 330/136; 330/289; 330/285
[58] Field of Search ............... 330/136, 289, 285, 298, 330/207 P; 455/116, 117, 126, 127

[56] References Cited

U.S. PATENT DOCUMENTS

| | | | |
|---|---|---|---|
| 3,486,128 | 12/1969 | Lohrmann | 330/285 |
| 4,210,874 | 7/1980 | Moskowitz | 330/136 |
| 4,574,248 | 3/1986 | Snodgrass | 330/136 |
| 4,591,800 | 5/1986 | Opas | 330/149 |

FOREIGN PATENT DOCUMENTS 634450  11/1978  U.S.S.R. .................. 330/136

OTHER PUBLICATIONS

Electronics Letters, Apr. 8, 1971, vol. 7, No. 7 pp. 145-146 "Linear Amplification Using Envelope Feedback".

Primary Examiner—Eugene R. Laroche
Assistant Examiner—Tan Dinh
Attorney, Agent, or Firm—Edward D. Manzo

[57] ABSTRACT

In a linear amplifier circuit, an amplifier amplifies an input signal to produce an output signal, an input signal envelope detector detects the envelope of the input signal, and an output signal envelope detector detects the envelope of the output signal. The difference between the outputs of the envelope detectors is determined, and the amplifier is controlled in accordance with the difference so that the level of the output signal is linearly related to the input signal. Compensation circuits are provided for temperature compensation of the linearity in the characteristic of the envelope detectors.

8 Claims, 4 Drawing Sheets

LINEAR AMPLIFIER CIRCUIT

FIELD OF THE INVENTION

The present invention relates to a linear amplifier circuit used for power amplification in a radio transmitter.

BACKGROUND OF THE INVENTION

In a method for efficiently amplifying a signal having an amplitude-modulated component without distortion, an envelope feedback is employed.

FIG. 1 shows an example of prior art linear amplifier circuit employing the envelope feedback. This prior art is shown, for example, in Electronics Letters, Apr. 8th, 1971, Vol. 7, No. 7, pp. 145 to 146. Referring to FIG. 1, a situation in which a QAM (quadrature amplitude modulated) signal is amplified. The QAM signal contains information of both the amplitude component and the phase component. It is therefore necessary to perform the amplification with a high fidelity with respect to the amplitude and the phase components in order to eliminate distortion in amplification.

A QAM signal input to the input terminal 10 is divided into two parts at a powder divider 1 (or a hybrid). One part is sent to a limiter 2, and the other part is input to an input signal detector 5. In the limiter 2, the amplitude component of the signal is removed, and its output is input to a saturation-type amplifier (non-linear amplifier) 3, where the signal is power-amplified and the amplified signal is output via an output terminal 11. The output power of the saturation-type amplifier 3 is controlled in accordance with the voltage applied to a power control terminal 9. Part of the output power of the saturation-type amplifier 3 is derived by means of a coupling capacitor, a coupling stripe line or the like, and input to and detected by an output signal detector 4. The output of the output signal detector 4 is an envelope component of the output power, i.e., a signal proportional to the amplitude component, which is passed through a DC amplifier ($\beta 1$) 6 to a first input terminal of the comparator 8. The comparator 8 determines the difference between the signals input to the first and the second input terminals and applies the difference as a feedback voltage, after adding it to the input signal on the first input terminal, to the power control terminal 9 of the saturation-type amplifier 3.

That is, the envelope of the input signal from the input terminal 10 is compared, at all times, with the envelope of the output signal from the saturation-type amplifier 3, and the error is fed back to the saturation-type amplifier 3, so that the input signal is amplified without giving distortion to the envelope.

With the above described linear amplifier, the detection characteristic of the output signal detector 4 and the input signal detector 5 varies with temperature, so distortion may occur when the temperature varies.

That is, the detection characteristic of the output signal detector 4 and the input signal detector 5 must be linear as shown by a solid line in FIG. 2. But the detection characteristic varies with temperature variation considerably, as shown by a broken line (for a higher temperature) and a chain line (for a lower temperature). As is also seen from FIG. 2, the variation with temperature is larger at the low power region. When the linearity is degraded, the amplitude information in the output signal is distorted. Moreover, this expands the transmission spectrum.

SUMMARY OF THE INVENTION

An object of the invention is to provide a linear amplifier circuit with an envelope feedback with which the linearity is not degraded with temperature variation.

A linear amplifier circuit according to the invention comprises:

an amplifier for amplifying an input signal to produce an output signal;

an input signal envelope detector for receiving at its input terminal the input signal and detecting the envelope of the input signal;

an output signal envelop detector for receiving at its input terminal the output signal and detecting the envelope of the output signal;

means for determining the difference between the output of the input signal envelope detector and the output signal of the output signal envelope detector;

means for controlling the amplifier in accordance with the difference so that the level of the output signal is linearly related to the input signal; and compensation means for performing temperature compensation of the linearity in the characteristic of the envelope detectors.

By providing temperature compensation for the linearity of the detection characteristic of the detector for input signal envelope and the detector for output signal envelope, the error between the envelopes of the input signal and the output signal is accurately detected and fed back, without being affected by the temperature variation, and the linearity in the input-output characteristic of the linear amplifier circuit is maintained.

DETAILED DESCRIPTION OF THE PREFERRED EMBODIMENTS

Figure 1:
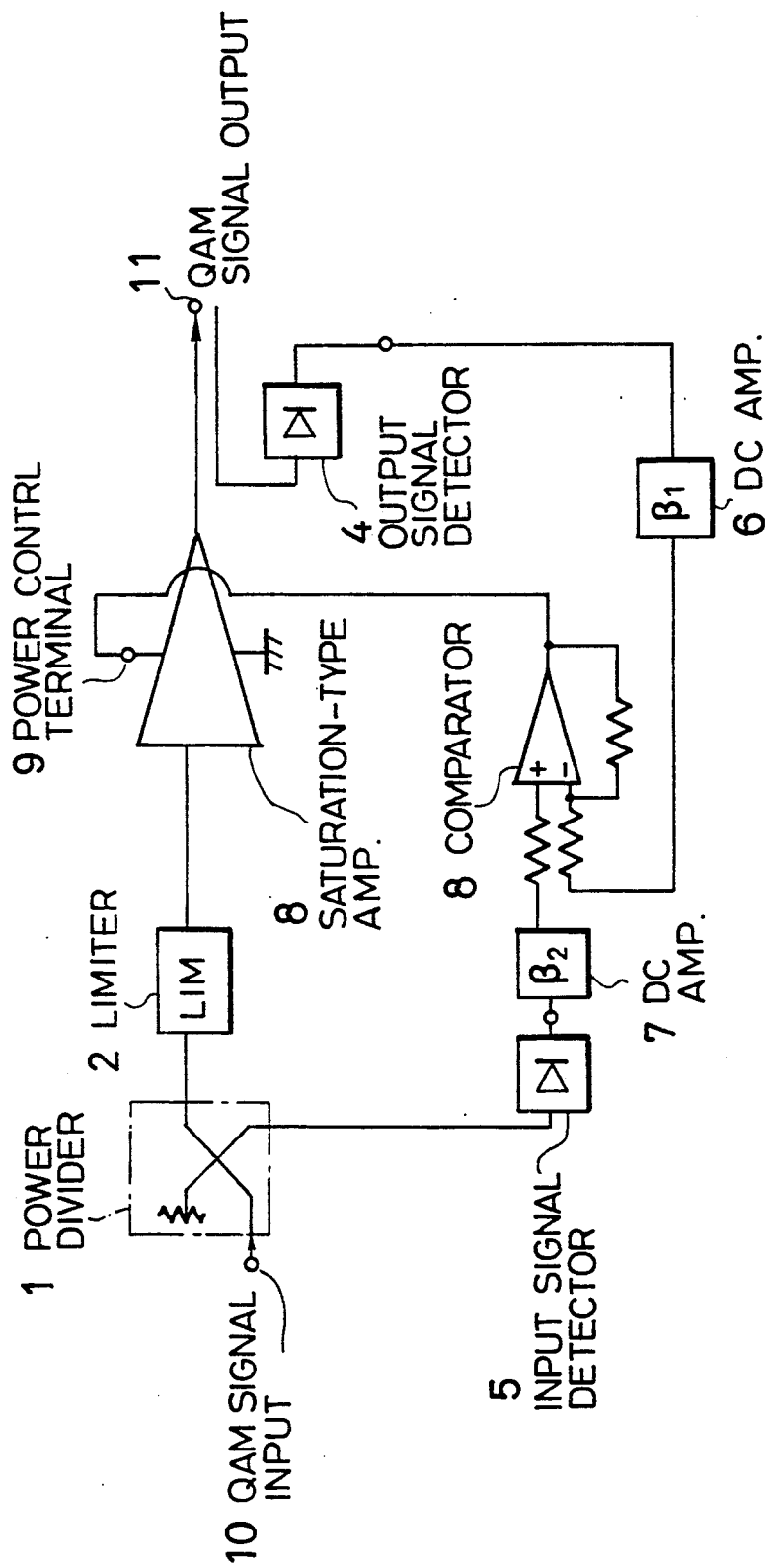
FIG. 1 is a block diagram showing a linear amplifier circuit in the prior art.
Figure 3:
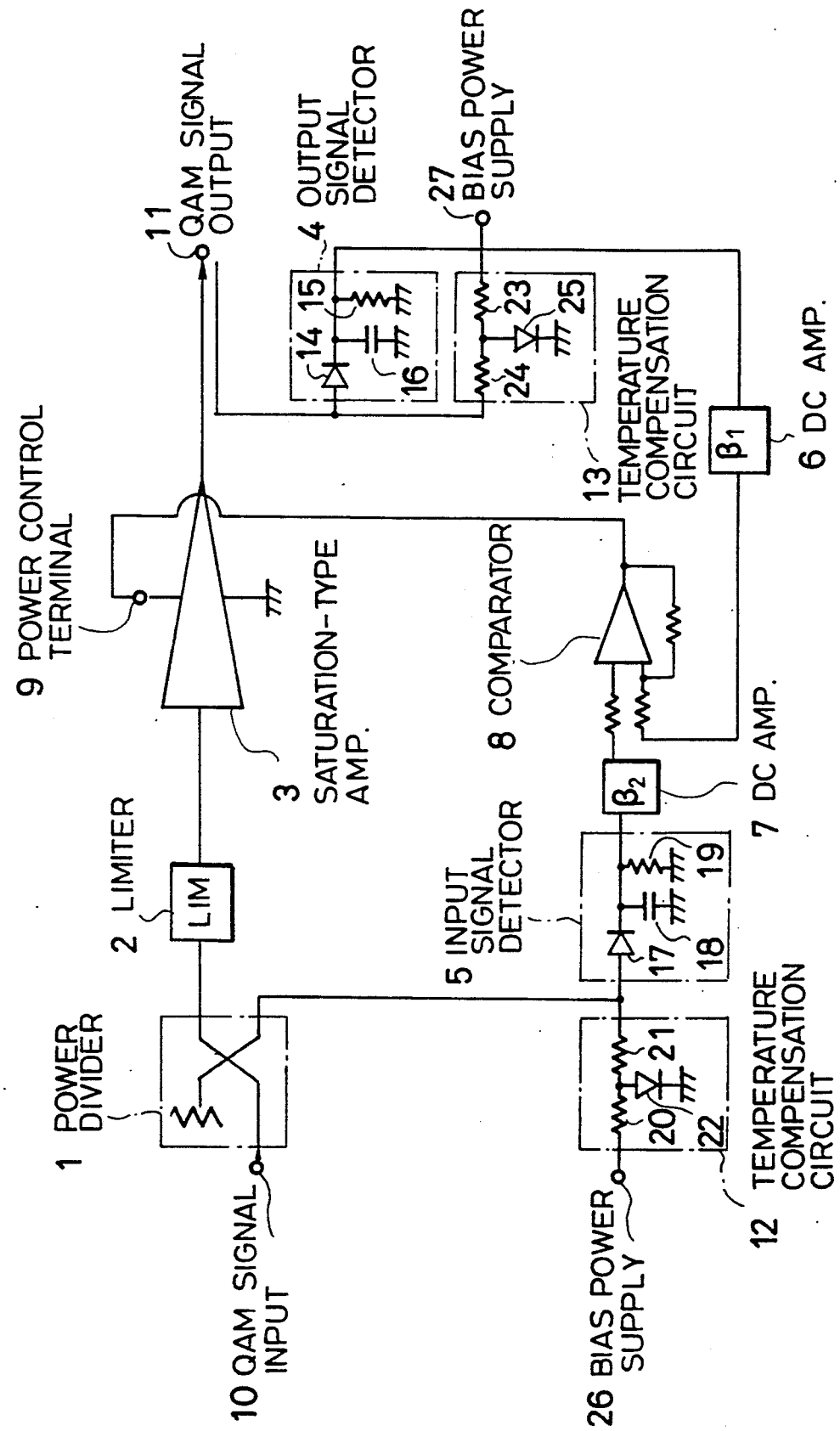
FIG. 3 is a block diagram showing a linear amplifier circuit of an embodiment of the invention.

Referring to FIG. 3, the linear amplifier circuit of this embodiment is similar to that shown in FIG. 1, but differs from it in that it is provided with a temperature compensation circuit 12 for compensating for the temperature characteristic of the input signal detector 5, another temperature compensation circuit 13 for compensating for the temperature characteristic of the output signal detector 4.

The temperature compensation circuit 12 comprises a bias power supply terminal 26 connected to a bias power supply of a fixed potential Vbias, e.g., 5 V, a resistor 20 having one end connected to the bias power supply terminal 26, a diode 22 having its anode connected to the other end of the resistor 21 and its cathode connected to the ground and generating a biasing voltage by its forward voltage drop due to the current through it which is determined by the resistor 20, a decoupling resistor 21 having one end connected to the anode of the diode 22 and having the other end connected to the input of the input signal detector 5 to transmit the biasing voltage to the input signal detector 5 while at the same time preventing leakage of a high-frequency power from the power divider 1 to the biasing power supply 26. Similarly, the temperature compensation circuit 13 comprises a biasing power supply terminal 27 connected to the bias power supply Vbias, a resistor 23 having one end connected to the bias power supply 27, a diode 25 having its anode connected to the other end of the resistor 23 and its cathode grounded, and generating a biasing voltage by its forward voltage drop due to a current through it that is determined by the resistor 25, a decoupling resistor 24 having one end connected to the anode of the diode 26 and the other end connected to the input of the output signal detector 4 to transmit the biasing voltage to the output signal detector 4 while at the same time preventing leakage of a high-frequency power from the QAM signal output to the biasing power supply.

The output signal detector 4 is comprised of a detecting diode 14, a resistor 15, and a capacitor 16. The input signal detector 5 is comprised of a detecting diode 17, a resistor 19 and a capacitor 18.

Figure 2:
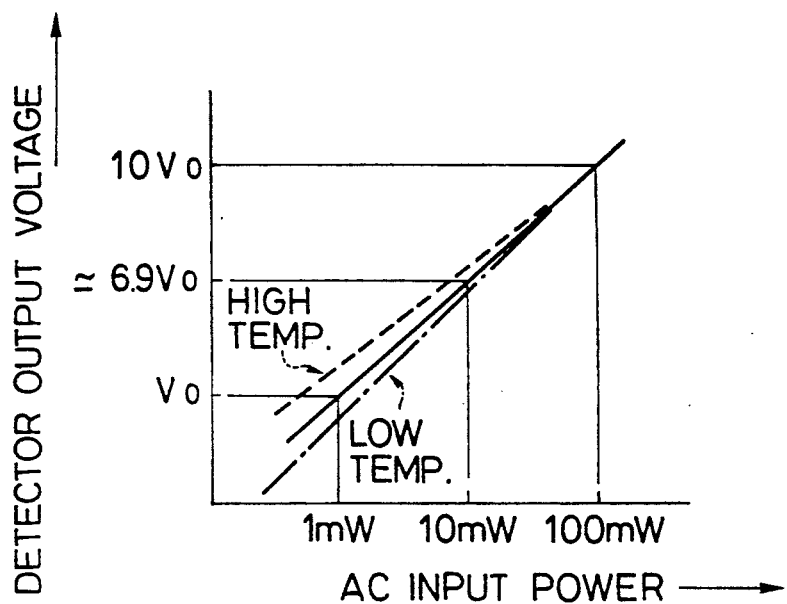
FIG. 2 is a diagram showing the detection characteristic, and its variation with temperature.

The operation of the compensation circuit 12 and 13 will now be described. The detecting diodes 14 and 17 of the signal detectors 4 and 5 have an a.c. to d.c. conversion characteristic as shown in FIG. 2. That is, in the region of smaller a.c. input power, the d.c. output voltage is shifted upward with higher temperatures, and is shifted downward with lower temperatures.

Figure 4:
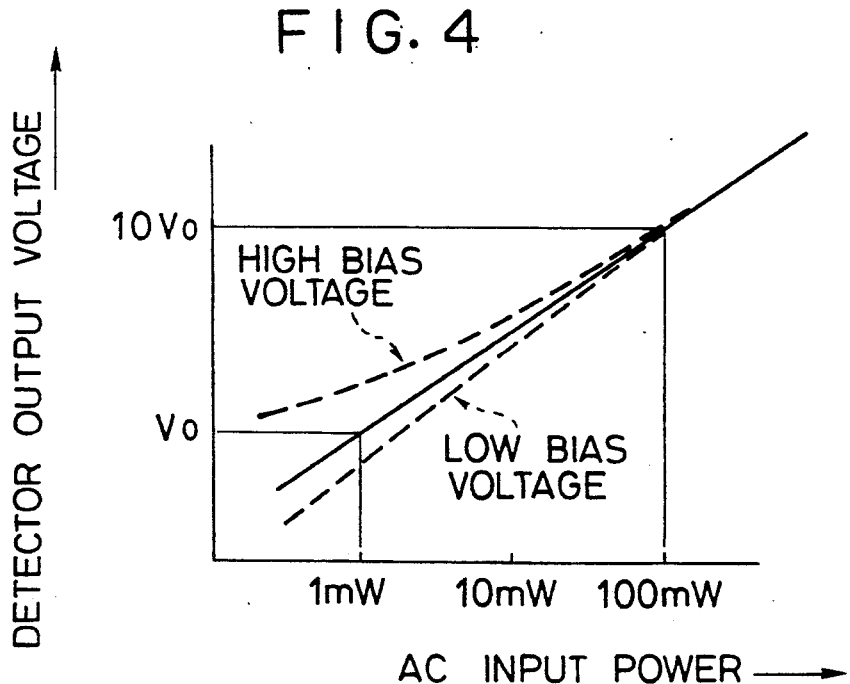
FIG. 4 is a diagram showing the detection characteristic and its variation with bias voltage.

On the other hand, the conversion characteristic (detection characteristic) is varied in relation to the diode biasing voltage as shown in FIG. 4. That is, in the region of smaller a.c. input power, the d.c. output voltage is shifted upward with higher biasing voltages, and is shifted downward with lower biasing voltages, and the best linearity is obtained with the optimum biasing voltage. By lowering the biasing voltage for the diodes 14 and 17 with a higher temperature, the variation in the characteristic due to the temperature change can be canceled.

The biasing voltage as applied to the detector 4 or 5 is determined by the forward voltage drop across the diode 25 or 22. For simplicity of explanation, the current through the diode 25 or 22 can be assumed substantially fixed because most of the voltage drop for the biasing power supply is caused to occur across the resistor 24 or 20.

Figure 5:
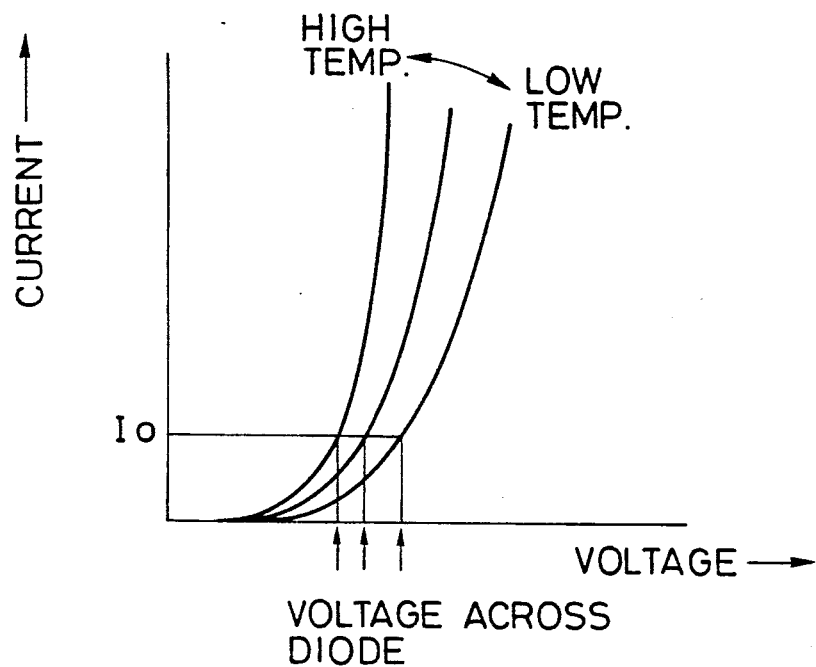
FIG. 5 is a diagram showing the voltage-current characteristic with the temperature taken as a parameter.

This current is indicated as Io in FIG. 5. The voltage drop across the diode 25 or 22 with its current fixed at Io is decreased with higher temperatures and is increased with lower temperatures, as shown in FIG. 5. Accordingly, with higher temperatures the biasing voltage is lower (FIG. 5) to tend to lower the detector output voltage (FIG. 4) thereby canceling the effect of higher temperatures on the detector characteristic (FIG. 2). With lower temperatures the biasing voltage is higher (FIG. 5) to tend to raise the detector output voltage (FIG. 4) thereby canceling the effect of lower temperatures on the detector characteristic (FIG. 2).

In this way, by compensating for the temperature characteristic of the signal detectors 4 and 5 by means of the temperature compensating circuits 12 and 13, the overall characteristic of the linear amplifier circuit can be maintained linear regardless of the temperature variation.

Figure 6A:
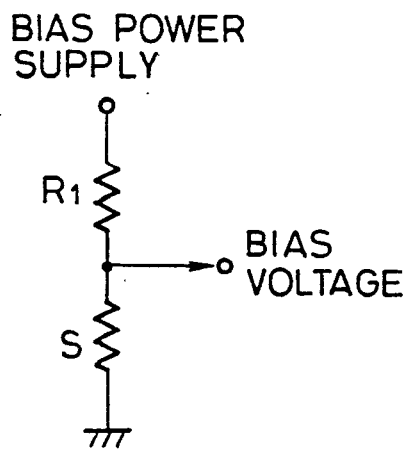
FIG. 6A and FIG. 6B are diagrams showing other examples of temperature compensation circuits.
Figure 6B:
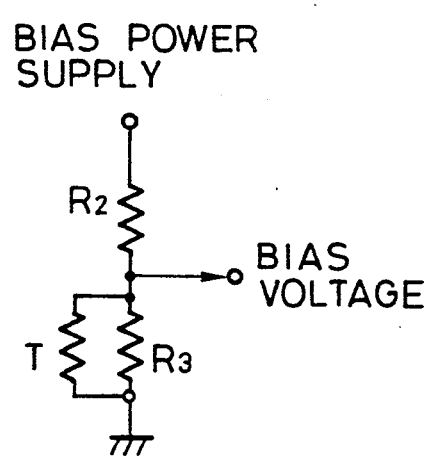

What is required of the temperature compensating circuit is to provide a biasing voltage with a negative temperature characteristic to the detecting diodes of the signal detectors, and the temperature compensating circuit is not limited to that shown in FIG. 3. Other examples of the temperature compensating circuit are shown in FIG. 6A and FIG. 6B, in which R1, R2 and R3 denotes resistors, S denotes a temperature-sensitive resistor, such as a critical temperature resistor, and T denotes a thermistor. The resistor R3 (FIG. 6B) parallel with the thermistor T may be omitted. On the other hand, another resistor, not shown, may be connected in parallel with the temperature-sensitive resistor S. Decoupling resistors, similar to those, 21, 24 in FIG. 3, may be added.

As has been described according to the invention, means are provided to compensate for the temperature variation of the linearity of the detecting characteristic of the detector for envelope detection, so generation of distortion in the envelope feedback operation due to the temperature variation is restrained, and normal linear amplification is achieved even under the temperature variation.

The invention is particularly useful when implemented in a transmission linear amplifier in a transmitter for mobile telephone in which the environment in which the amplifier is used is severe.

What is claimed is:

1. A linear amplifier circuit comprising:
   an amplifier for amplifying an input signal to produce an output signal;
   an input signal envelope detector for receiving at its input terminal the input signal and detecting an envelope of the input signal;
   an output signal envelope detector for receiving at its input terminal the output signal and detecting an envelope of the output signal;
   means for determining a difference between the output of the input signal envelope detector and the output signal of the output signal envelope detector;
   means for controlling the amplifier in accordance with the difference so that a level of the output signal is linearly related to the input signal; and
   compensation means for performing temperature compensation of a linearity in a characteristic of the input and output signal envelope detectors wherein at least one of said input and output signal envelope detectors has a characteristic in which its output is increased with a higher temperature, and its output is decreased with a lower biasing voltage, and said compensation means produces a bias voltage which is lowered with a higher temperature, and is provided with a first and a second compensation circuit being coupled to said input and output signal envelope detectors, respectively, for performing temperature compensation of the linearity in the characteristic of said input and output signal envelope detectors.

2. The circuit of claim 1 wherein another of said envelope detectors has a characteristic in which its output is raised with a high temperature, and its output is lowered with a lower biasing voltage, and said compensation means produces a bias voltage which is lowered with a higher temperature.

3. The circuit of claim 1 wherein said first and second compensation circuits comprise a first resistor having a first end connected to a bias power supply of a fixed potential, a temperature-sensitive element having its first terminal connected to a second end of the first resistor, and having its second terminal grounded, said first terminal being coupled to the input of the envelope detector for which the compensation circuit is provided, the voltage drop across said temperature-sensitive element being lowered with a higher temperature.

4. The circuit of claim 3, wherein said temperature-sensitive element is a diode having its anode and cathode constituting said first and second terminals, respectively.

5. The circuit of claim 3 wherein said temperature sensitive element is a temperature-sensitive resistor.

6. The circuit of claim 3 wherein said temperature-sensitive element is a thermistor.

7. The circuit of claim 3 wherein said temperature-sensitive element further comprises a further resistor coupling said first terminal for said temperature-sensitive element to said input of said at least one envelope detector.

8. A method for linearly amplifying an input signal comprising the steps of:
  supplying a bias power supply to a plurality of temperature compensation circuits;
  supplying an output of one of said plurality of temperature compensation circuits to a terminal of an input detector circuit;
  supplying an input signal to said terminal of an input detector circuit and to an amplifier;
  supplying an output signal of said amplifier to a teerminal of an output signal detector;
  supplying an output of another of said plurality of temperature compensation circuits to said terminal of an output signal detector;
  supplying an output of each of said input and output signal detectors to a comparator;
  supplying an output of said comparator to a power control terminal of said amplifier so that said output signal is linearly related to said input signal; and
  outputting said output signal of said amplifier to an output terminal.

* * * * *